(12) United States Patent
Nam et al.

(10) Patent No.: US 7,989,271 B2
(45) Date of Patent: Aug. 2, 2011

(54) METHOD FOR FABRICATING AN LCD DEVICE

(75) Inventors: Yeon Heui Nam, Gangneung Si (KR); Jin Wuk Kim, Uiwang-Si (KR)

(73) Assignee: LG Display Co., Ltd., Seoul (KR)

( * ) Notice: Subject to any disclaimer, the term of this patent is extended or adjusted under 35 U.S.C. 154(b) by 765 days.

(21) Appl. No.: 11/980,817

(22) Filed: Oct. 31, 2007

(65) Prior Publication Data

US 2008/0121612 A1 May 29, 2008

(30) Foreign Application Priority Data

Nov. 29, 2006 (KR) .................. 10-2006-0119041

(51) Int. Cl.
*H01L 21/00* (2006.01)
*H01L 21/84* (2006.01)

(52) U.S. Cl. .................. 438/149; 438/496; 438/780

(58) Field of Classification Search .................. None
See application file for complete search history.

(56) References Cited

U.S. PATENT DOCUMENTS

| | | | |
|---|---|---|---|
| 6,334,960 B1 * | 1/2002 | Willson et al. .................. 216/52 |
| 7,754,780 B2 * | 7/2010 | Kim .................. 522/25 |
| 2003/0138589 A1 | 7/2003 | Takemori et al. |
| 2005/0140909 A1 | 6/2005 | Kim et al. |
| 2005/0230346 A1 * | 10/2005 | Kasumi et al. .................. 216/44 |
| 2005/0282402 A1 * | 12/2005 | Kim .................. 438/780 |
| 2006/0249886 A1 * | 11/2006 | Chao et al. .................. 264/496 |

FOREIGN PATENT DOCUMENTS

CN 1638545 A 7/2005

* cited by examiner

*Primary Examiner* — Duy Deo
(74) *Attorney, Agent, or Firm* — McKenna Long & Aldridge LLP

(57) ABSTRACT

A method for fabricating an LCD device is disclosed, in which a reliable thin film pattern is formed as process deviation is minimized. The method includes forming a thin film on a substrate; forming an etch resist solution on the thin film; applying a soft mold having a concave portion and a convex portion to the etch resist solution, wherein the convex portion includes a first width and a second width different than the first width; forming an etch resist pattern having a predetermined linewidth controlled by the pressure applied by the soft mold; hardening the etch resist pattern; separating the soft mold from the substrate; and patterning the thin film using the etch resist pattern as a mask.

12 Claims, 13 Drawing Sheets

<Case where a thin film pattern is not pressurized>

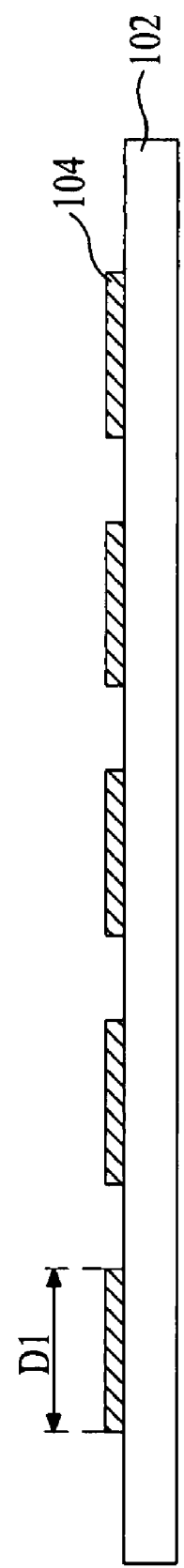

<Case where a thin film pattern is pressurized>

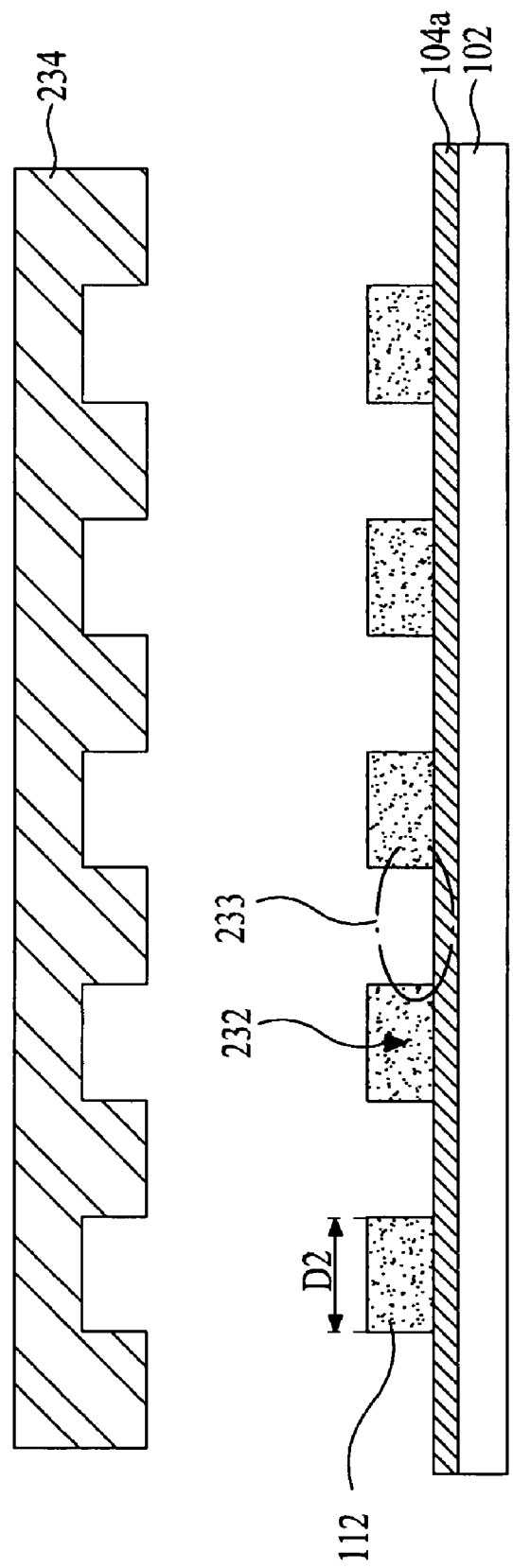

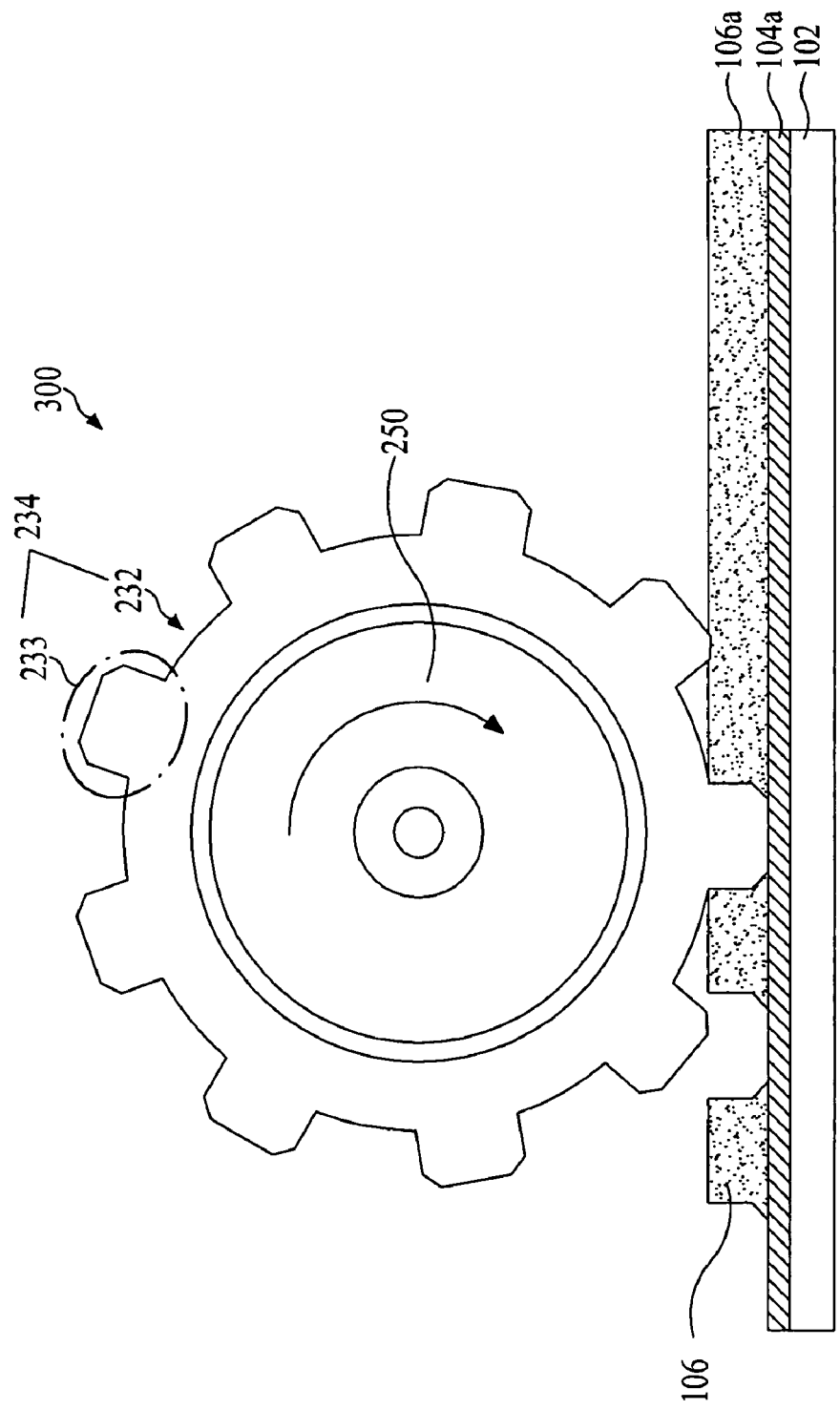

METHOD FOR FABRICATING AN LCD DEVICE

This application claims the benefit of Korean Patent Application No. 10-2006-0119041, filed on Nov. 29, 2006, which is hereby incorporated by reference for all purposes as if fully set forth herein.

BACKGROUND OF THE INVENTION

1. Field of the Invention

The present invention relates to a flat panel display device. More particularly, the present invention relates to a method for fabricating an LCD device, in which a patterning process is performed without using photolithography. This simplifies the fabricating process while simultaneously improving the exactness of alignment. Thus, the thin film pattern for the flat panel display device is formed to be positioned correctly.

2. Discussion of the Related Art

The display technology industry has emphasized flat panel display devices as important visual information communication media. Display devices, such as devices including cathode ray tubes (CRTs) or Braun tubes, are losing popularity because they are inconveniently large and heavy.

Examples of flat panel display devices include liquid crystal display (LCD) devices, field emission display (FED) devices, plasma display panel (PDP) devices and electroluminescence (EL) displays. Most of these display devices are available to the ordinary consumer.

Recent breakthroughs in research and development have lead to improving mass production of these flat panel display devices. Accordingly, flat panel display devices have become viable replacements for CRTs in many applications.

Active matrix LCD devices provide excellent picture quality and consume little power. In active matrix LCD devices, a thin film transistor ("TFT") is used to drive a liquid crystal cell. The improvements in the mass production of flat panel display devices have particularly lead to the rapid development of large and high-resolution active matrix type LCD devices.

An active matrix LCD device, as illustrated in FIG. 1, includes a color filter array substrate 22 and a TFT array substrate 23 bonded together with a liquid crystal layer 15 between them. The LCD device illustrated in FIG. 1 represents a part of the entire effective screen area.

The color filter array substrate 22 may include a color filter layer 13 and a common electrode 14 formed on the rear surface of an upper glass substrate 12. A polarizer 11 may be adhered to the front surface of the upper glass substrate 12. The color filter layer 13 may include red (R), green (G) and blue (B) color filters that transmit visible light in a specific wavelength band, thereby enabling color display. A black matrix (not shown) is formed between adjacent color filters in the color filter layer 13.

The TFT array substrate 23 includes data lines 19 and gate lines 18 that cross each other on the upper surface of a lower glass substrate 16. TFTs 20 are formed at the crossings of the data lines 19 with the gate lines 18. A pixel electrode 21 may be formed at a cell area between the data line 19 and the gate line 18 on the upper surface of the lower glass substrate 16. The TFT 20 switches a data transmission path between the data line 19 and the pixel electrode 21 in response to a scan signal from the gate line 18, thereby driving the pixel electrode 21. A polarizer 17 may be adhered to the rear surface of the TFT array substrate 23.

The liquid crystal layer 15 controls the amount of light transmitted through the TFT array substrate 23 by application of an electric field to the liquid crystal layer 15.

The polarizers 11 and 17 adhered to the color filter substrate 22 and the TFT substrate 23, respectively, polarize and transmit light in any direction. When the liquid crystal 15 is in a 90° twisted nematic (TN) mode, their polarizing directions perpendicularly cross each other.

An alignment film (not shown) may be formed on the liquid crystal layer 15 at surfaces opposite to the color filter substrate 22 and the TFT array substrate 23.

A related art process of fabricating the active matrix type LCD device includes a substrate cleaning process, a substrate patterning process, an alignment film forming/rubbing process, a substrate bonding/liquid crystal injecting process, a packaging process, an inspection process, a repair process and other suitable processes. The substrate cleaning process removes impurities that contaminate the substrate surface with a cleaning solution. The substrate patterning process includes a color filter substrate patterning process and a TFT array substrate patterning process. The alignment film forming/rubbing process coats an alignment film over each of the color filter substrate and the TFT array substrate, and rubs the alignment film with a rubbing cloth. The substrate bonding/liquid crystal injecting process bonds the color filter substrate with the TFT array substrate by using a sealant, injects liquid crystal and spacers through a liquid crystal injection hole, and then seals the liquid crystal injection hole. The packaging process connects a tape carrier package (TCP) to a pad part of the substrate. The TCP may be packaged with an integrated circuit (IC) such as a gate drive IC and a data drive IC. The drive IC may directly be mounted on the substrate by a chip-on-glass (COG) method and a tape automated bonding (TAB) method that uses the TCP. The inspection process may include an electrical inspection process that may be performed after forming the pixel electrode and the data lines and gate lines in the TFT array substrate. This inspection process also may include electrical inspection and macrography processes that may be performed after the substrate bonding/liquid crystal injecting process. If the outcome of the inspection process is a determination that the substrate is repairable, then restoration of the substrate is performed by a repair process. Also, the inspection process may determine that the substrate is sufficiently correct to go on to the next processing step. Substrates that are determined not to be repairable are disposed.

In fabricating most flat panel display devices including LCD devices, a thin film material deposited on the substrate may be patterned by a photolithography process. The photolithography process involves a series of photolithography steps such as photo-resist coating, mask aligning, exposure, development and cleaning. However, photolithography processes have several problems. For example, the time required to complete the photolithography process is long. Also, expensive equipment, such as exposure equipment, is required, and photo-resist materials and stripping solutions are wasted.

SUMMARY OF THE INVENTION

Accordingly, the present invention is directed to a method for fabricating an LCD device that substantially obviates one or more of the problems due to limitations and disadvantages of the related art.

An advantage of the present invention is to provide a method for fabricating an LCD device, in which process deviation is minimized to thereby form a reliable thin film pattern.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, a method of fabricating an LCD device includes forming a thin film on a substrate; forming an etch resist solution on the thin film; applying a soft mold having a concave portion and a convex portion to the etch resist solution, wherein the convex portion includes a first width and a second width different than the first width; forming an etch resist pattern having a predetermined linewidth controlled by the pressure applied by the soft mold; hardening the etch resist pattern; separating the soft mold from the substrate; and patterning the thin film using the etch resist pattern as a mask.

In another aspect of the present invention, a method of fabricating an LCD device includes forming a thin film on a substrate; forming an etch resist solution on the thin film; rolling a printing roller having a concave portion and a convex portion on the etch resist solution, wherein the convex portion includes a first width and a second width different than the first width, thereby forming an etch resist pattern having a predetermined linewidth controlled by the pressure applied by the printing roller; hardening the etch resist pattern; and patterning the thin film using the etch resist pattern as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings:

FIG. 5A, FIG. 5B and FIG. 5C are sectional views illustrating process steps of forming a thin film pattern by using the weight of a soft mold without pressure;

FIG. 6A, FIG. 6B and FIG. 6C are sectional views illustrating process steps of forming a thin film pattern by using the weight of a soft mold with pressure; and FIG. 7A and FIG. 7B illustrate an apparatus for fabricating a thin film pattern and a method for fabricating a thin film pattern according to another embodiment of the present invention.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or similar parts.

Figure 1:
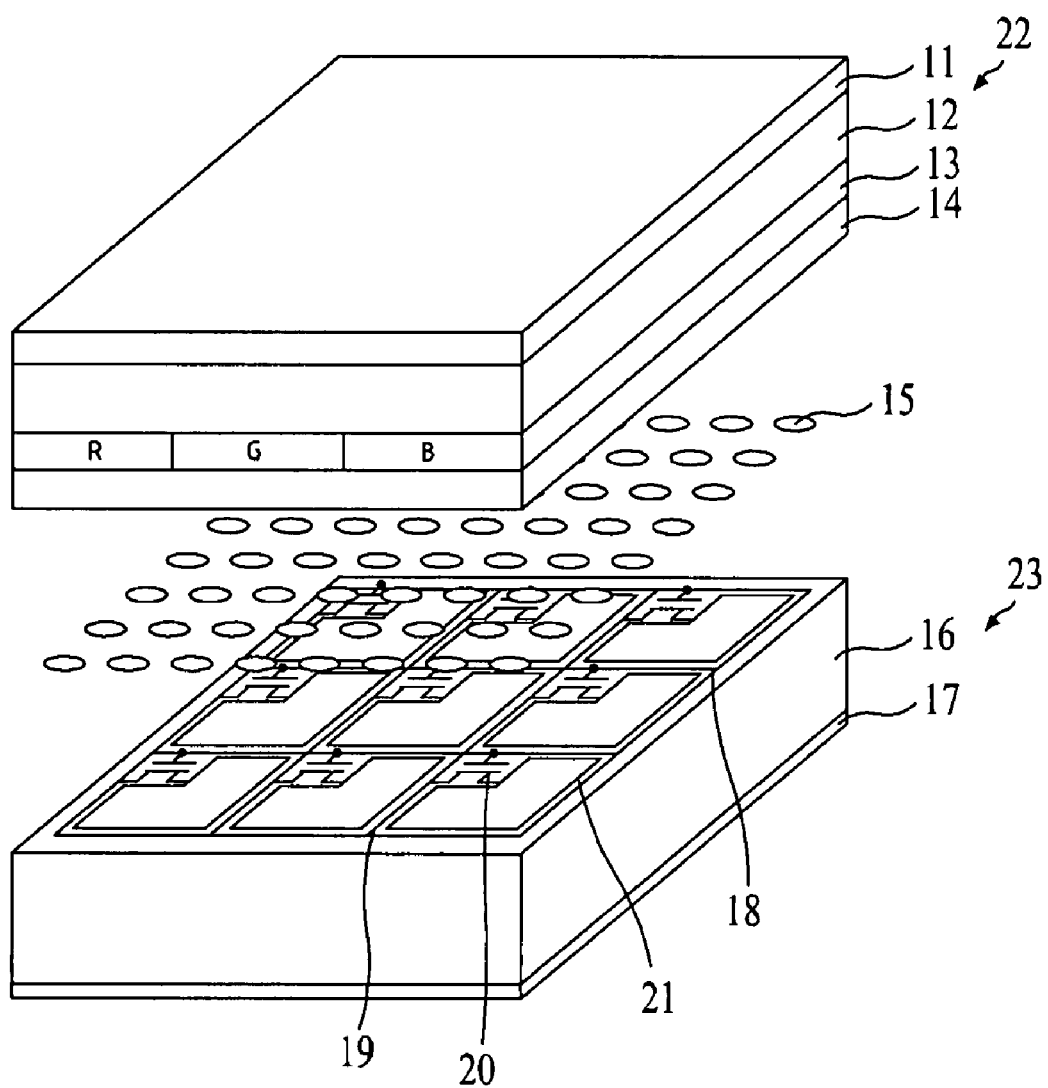
FIG. 1 is a perspective view illustrating an active matrix type liquid crystal display device according to the related art.
Figure 2:
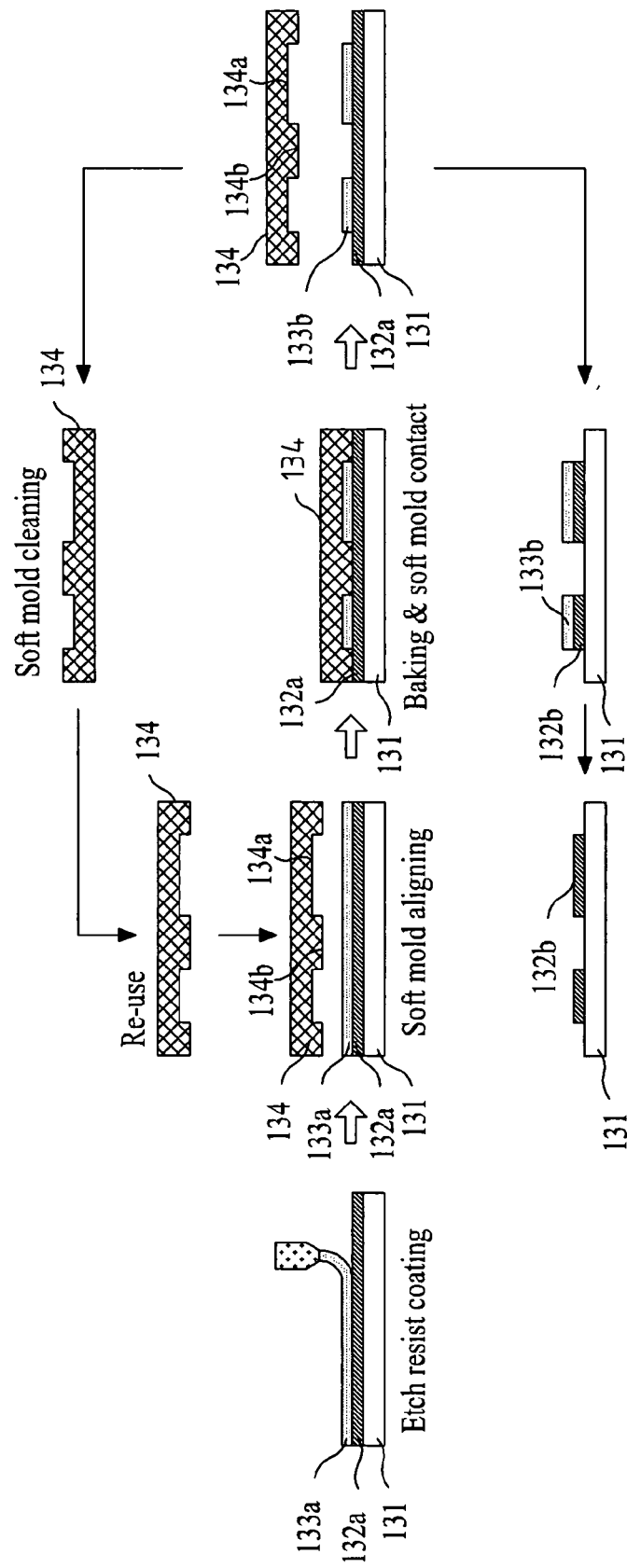
FIG. 2 illustrates an apparatus according to an embodiment of the invention for fabricating a thin film pattern for an in-plane printing non-exposure process and a method for fabricating the thin film pattern using the apparatus.

FIG. 2 illustrates an apparatus according to an embodiment of the invention for fabricating a thin film pattern for an in-plane printing non-exposure process and a method for fabricating the thin film pattern using the apparatus.

The method for fabricating a thin film pattern may include coating an etch resist solution 133$a$ on a substrate 131 on which a thin film 132$a$ is formed, patterning an etch resist layer 133$a$ using a soft mold 134, etching the thin film 132$a$ to form a thin film pattern, stripping a remaining etch resist pattern, and inspecting the resultant structure.

The thin film 132$a$ may be formed of a metal material, an organic material and/or an inorganic material that are capable of use in a flat panel display device array. The material is deposited on the substrate 131 by a well-known coating process or deposition process.

The etch resist solution 133$a$ may include a main resin, which is either a liquid high polymer precursor or a liquid monomer. The etch resist solution 133$a$ may also include an activator, an initiator and a thermal flow derivative. The etch resist solution 133$a$ may have a predetermined polarity. The etch resist solution 133$a$ has viscosity in the range of 3-13 cp.

The etch resist solution 133$a$ may be coated on the thin film 132$a$ by a coating process such as nozzle injection and/or spin coating.

The soft mold 134 is formed of a rubber material having high elasticity, such as polydimethylsiloxane (PDMS), and is provided with a concave portion 134$a$ corresponding to a pattern to remain on the substrate 131. The soft mold 134 having the concave portion 134$a$ and a convex portion 134$b$ is surface-treated, thereby making the soft mold 134 hydrophobic or hydrophilic. For example, if the etch resist solution 133$a$ has hydrophilic, the soft mold 134 has hydrophobic and if the etch resist solution 133$a$ has hydrophobic, the soft mold 134 has hydrophilic. Hereinafter, an example of a hydrophobic soft mold and a hydrophilic etch resist solution will be described. The soft mold 134 has hydrophobic by being surface-treated by a hydrophobic process using SAMs (self-assembled monolayers).

The soft mold 134 may be aligned on the etch resist solution 133$a$. Then, the soft mold 134 presses against the etch resist solution 133$a$ under the weight of the soft mold to apply sufficient pressure to bring the soft mold 134 in contact with the film 132$a$.

Figure 3:
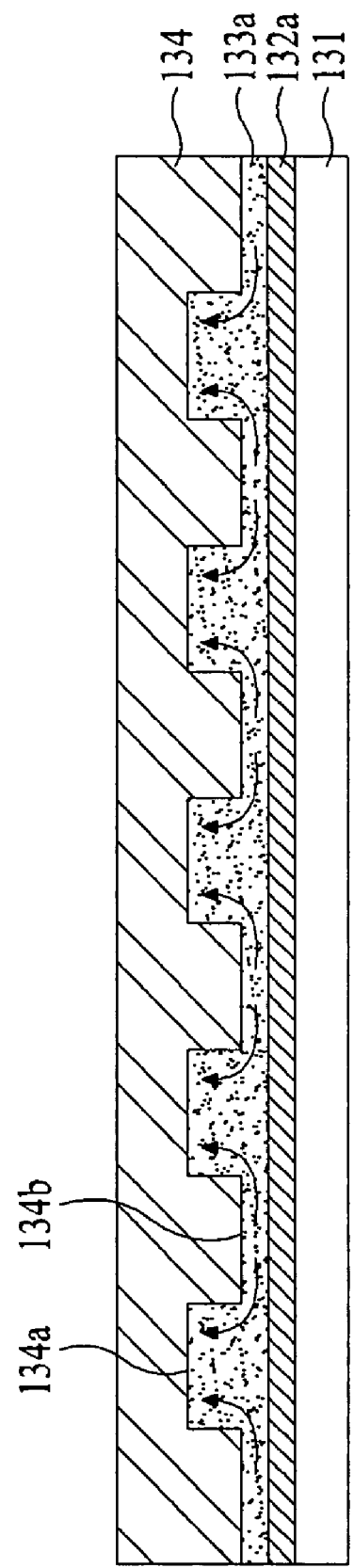
FIG. 3 illustrates an exemplary movement of an etch resist solution when a soft mold shown in FIG. 2 contacts a substrate.

At this time, as shown in FIG. 3, the etch resist solution 133$a$ moves into the concave portion 134$a$ of the soft mold 134 due to a capillary force generated by the pressure between the soft mold 134 and a glass substrate 131 and a repulsive force between the soft mold 134 and the etch resist solution 133$a$. As a result, an etch resist pattern 133$b$ is formed on the thin film 132$a$ in a pattern inversely transferred from a pattern of the concave portion 134$a$ of the soft mold 134. After a baking process or a hardening process using ultraviolet rays is performed, the soft mold 134 is separated from the substrate 131. Then, a wet etching process or a dry etching process may be performed. Because the etch resist pattern 133b functions as a mask, the thin film 132a located below the etch resist pattern 133b remains on the substrate 131 while other portions of thin film 132a are removed. Thus, thin film pattern 132b is formed. Subsequently, the etch resist pattern 133b is removed by a stripping process. Then, the thin film pattern 132b may be inspected for shorts, broken wires, etc. using electrical and optical tests.

After separation from the substrate 131, the soft mold 134 is cleaned with ultraviolet rays (UV) and ozone ($O_3$). Then, the cleaned soft mold 134 is re-used for patterning another thin film 132a.

As described above, as the thin film pattern is formed without photolithography, the fabricating process can be simplified.

The etch resist pattern 133b formed using the aforementioned soft mold 134 may have a process deviation or variation that is greater than that of a photoresist pattern formed by photolithography.

Hereinafter, an apparatus for fabricating a thin film pattern and a method for fabricating a thin film pattern using the same that prevents the etch resist pattern 133b from having the greater process deviation or variation will be described.

The apparatus for fabricating a thin film pattern according to an embodiment of the present invention includes a coating apparatus for coating an etch resist solution on a substrate on which a thin film is formed, a soft mold having a concave portion and a convex portion, pressurizing the etch resist to form an etch resist pattern having a shape corresponding to the concave portion, and a hardening apparatus for hardening the etch resist solution. The soft mold may have a structure as shown in FIG. 4.

Figure 4:
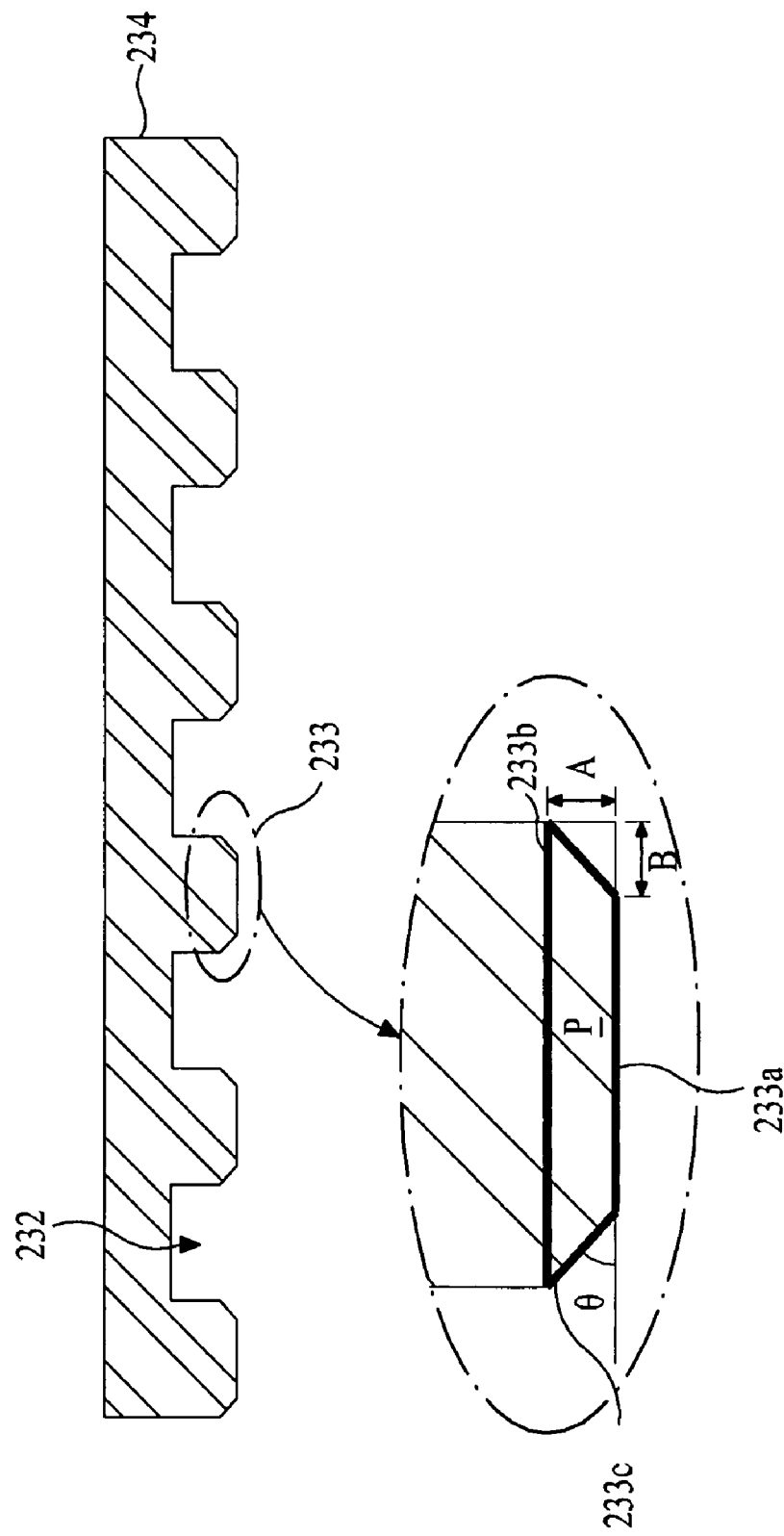
FIG. 4 is a sectional view illustrating a soft mold of an apparatus for fabricating a thin film pattern according to an embodiment of the present invention.

The soft mold 234 shown in FIG. 4 includes a concave portion 232 and a convex portion 233 that is convex based on the bottom of the concave portion 232.

An end of the convex portion 233 may be formed in a trapezoidal shape. A trapezoidal region P that is the end of the convex portion 233 includes a first plane 233a that is the outer surface of the convex portion 233, a second plane 233b that is parallel to the first plane 233a and has an area and line width greater than those of the first surface 233a, and at least two incline planes 233c that connect the first plane 233a and the second plane 233b.

An incline angle θ defined as an external angle between an extension of the first plane 233a and one of the at least two incline planes 233c and the height A of the trapezoidal region P between the first plane 233a and the second plane 233b serve to control the line width of the etch resist pattern, and depend upon pressure applied to the soft mold 234. That is, because the soft mold 234 is of mad PDMS, which has elasticity, and because the soft mold 234 is located above the etch resist solution, the trapezoidal region P is shrunken. When the pressure is removed, the trapezoidal region P is restored to its original shape.

Because the difference B between the line width of the first plane 233a and the line width of the second plane 233b may be controlled by the size of the pressure, the line width of the etch resist pattern can be controlled.

FIG. 5A to FIG. 6C illustrate process steps of forming an etch resist pattern and a thin film pattern using the soft mold of FIG. 4.

Figure 5A:
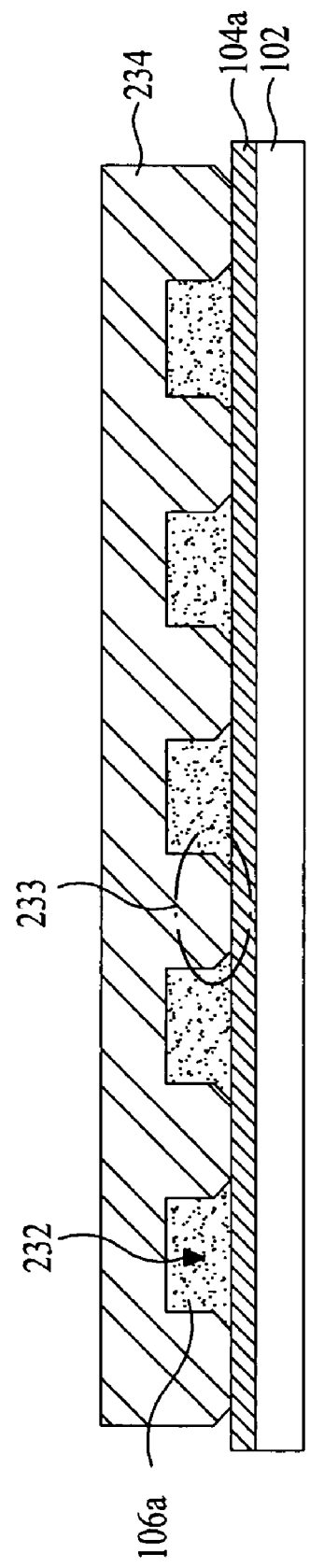
Figure 5B:
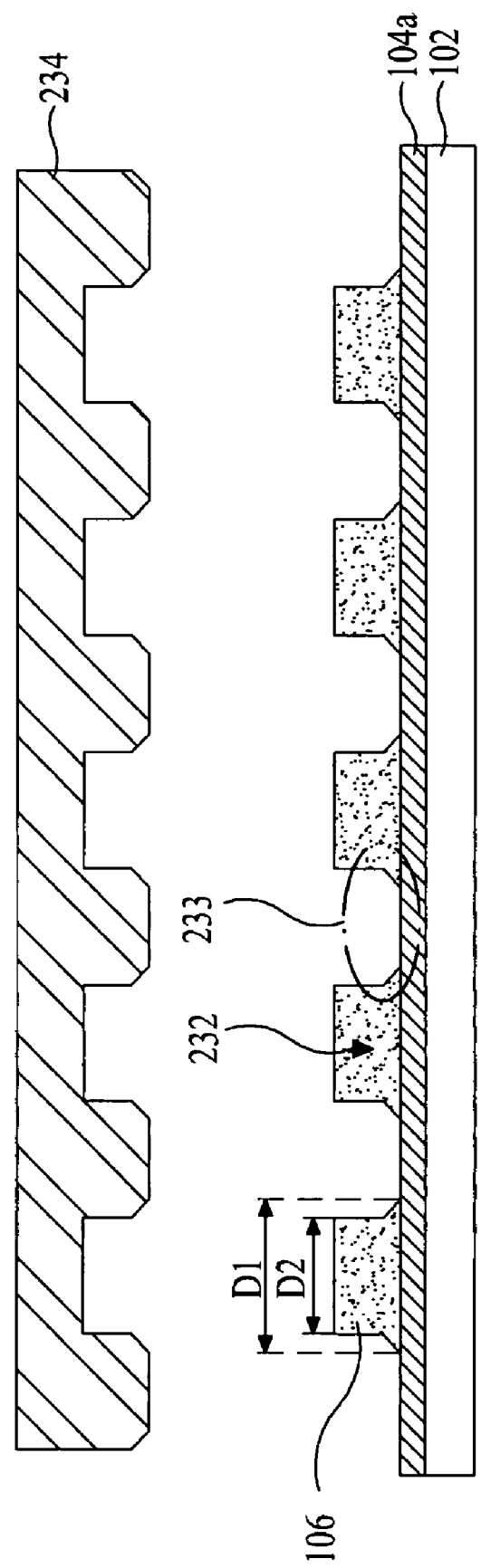

FIG. 5A to FIG. 5C illustrate forming an etch resist pattern and a thin film pattern using only the weight of the soft mold without additional pressure.

A thin film 104a may be formed on a substrate 102 by a deposition method such as sputtering and/or PECVD, and then an etch resist solution 106a is coated thereon.

The etch resist solution 106a includes a main resin, which is either a liquid high polymer precursor or a liquid monomer. The etch resist solution 106a also includes an activator, an initiator, a thermal flow derivative, and has a predetermined polarity.

The etch resist solution 106a may be coated on the thin film 104a by a coating process such as nozzle injection and/or spin coating.

The soft mold 234 shown in FIG. 4 is provided with a concave portion 232 that receives the etch resist solution 106a and a convex portion 233 that is convex based on the bottom of the concave portion 232.

If the soft mold 234 is mounted on the etch resist solution 106a, the etch resist solution 106a is pressurized by the weight of the soft mold only.

At this time, the etch resist solution 106a moves into the concave portion 232 of the soft mold 234 due to a capillary force generated by the pressure between the soft mold 234 and a substrate 102 and a repulsive force generated by the pressure between the soft mold 234 and the etch resist solution 106a.

As the soft mold 234 is separated from the substrate 102 after a baking process or a hardening process using ultraviolet rays is performed, as shown in FIG. 5B, an etch resist pattern 106 is formed on the thin film 104a in a pattern inversely transferred from a pattern of the concave portion 232 of the soft mold 234.

Because an end of the convex portion 233 of the soft mold 234 is formed in a trapezoidal shape, the lower width D1 of the etch resist pattern 106 is wider than the upper width D2 of the etch resist pattern 106.

Then, a wet etching process or a dry etching process is performed using the etch resist pattern 106 as a mask to form a thin film pattern 104 having the same width D1 as the lower width D1 of the etch resist pattern 106 as shown in FIG. 5C.

Figure 6A:
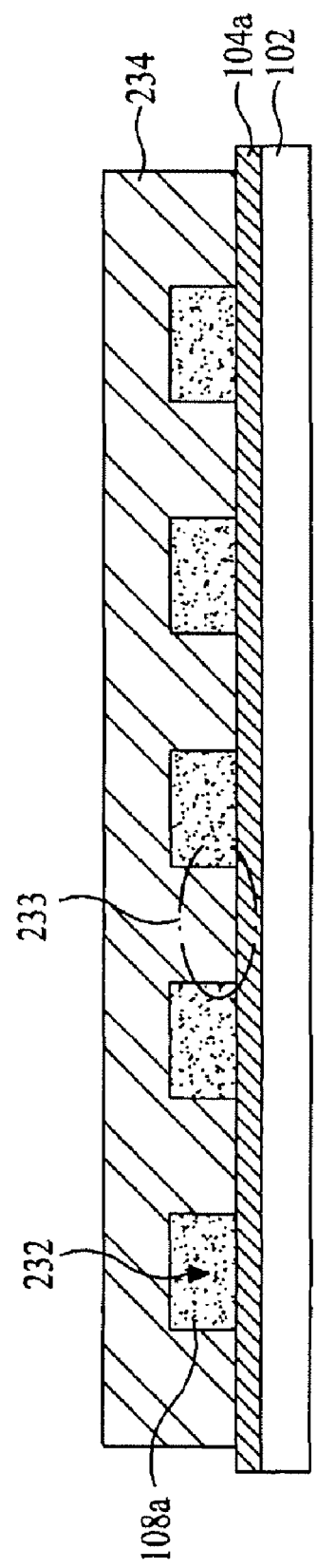
Figure 6C:
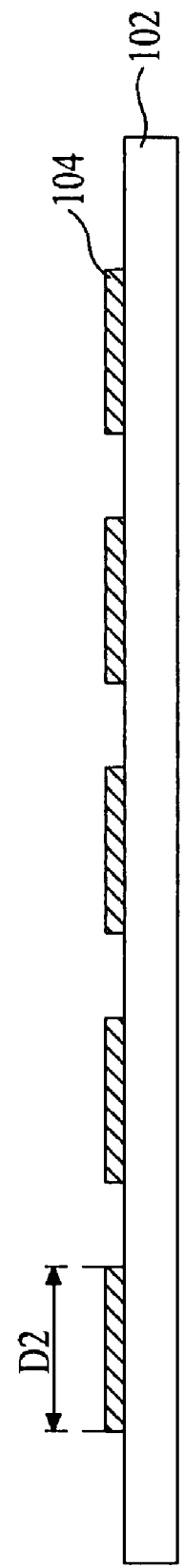

FIG. 6A to FIG. 6C illustrate the process steps of forming the etch resist pattern by using only the weight of the soft mold to pressurize the etch resist pattern.

A thin film 104a may be formed on a substrate 102 by a deposition method such as sputtering and/or PECVD, and then an etch resist solution 108a is deposited thereon.

The soft mold 234 shown in FIG. 4 includes a concave portion 232 that receives the etch resist solution 108a and a convex portion 233 that is convex based on the bottom of the concave portion 232.

If the soft mold 234 is mounted on the etch resist solution 106a, the etch resist solution 108a is pressurized by the weight of the soft mold only. In this case, the soft mold 234 is formed of a rubber material having high elasticity, such as polydimethylsiloxane (PDMS), and thus the end of the convex portion 233 is pressed.

At the same time, the etch resist solution 108a moves into the concave portion 232 of the soft mold 234 due to a capillary force generated by the pressure between the soft mold 234 and the substrate 102 and a repulsive force between the soft mold 234 and the etch resist solution 108a.

As the soft mold 234 is separated from the substrate 102 after a baking process or a hardening process using ultraviolet rays is performed, as shown in FIG. 6B, an etch resist pattern 112 is formed on the thin film 104a in a pattern inversely transferred from a pattern of the concave portion 232 of the soft mold 234.

In this case, because the trapezoidal region P at the end of the convex portion 233 of the soft mold 234 is pressed by pressure, the lower width D2 of the etch resist pattern 108 becomes substantially the same as the upper width D2 of the etch resist pattern 106b.

Then, a wet etching process or a dry etching process is performed using the etch resist pattern 112 as a mask to form a thin film pattern 104 having the same width D2 as the upper width D2 of the etch resist pattern 112 as shown in FIG. 6C.

As described above, as shown in FIG. 5A to FIG. 6C, the line widths of the etch resist patterns 106 and 108 may be controlled finely by the trapezoidal region P formed at the end of the convex portion 233 of the soft mold 234. That is, as the pressure of the soft mold 234 is controlled, the line width of the etch resist pattern 106 may be set within the range between the line width D1 of the etch resist pattern 106 in FIG. 5B and the line width D2 of the etch resist pattern 108 in FIG. 6B.

For example, when the thin film pattern is formed without additional pressure, if the line width is greater than that designed by a user, the pressure may be increased in the next process. In this case, the incline angle θ between the first plane 233a and the incline plane 233c in the trapezoidal region P of the convex portion 233 and the height A of the trapezoidal region P become small and at the same time the difference between the trapezoidal region P and the second plane 233b becomes small. If the etch resist solution is hardened, the lower width D1 of the etch resist pattern 106 may become narrower due to the pressure increase.

The pressure that satisfies the line width desired by the user is determined, and the soft mold 234 is pressurized by the determined pressure to minimize process deviation of the etch resist patterns 106 and 108. As a result, process deviation of the thin film pattern may be minimized to improve reliability of the thin film pattern formed by using the soft mold.

Figure 7B:
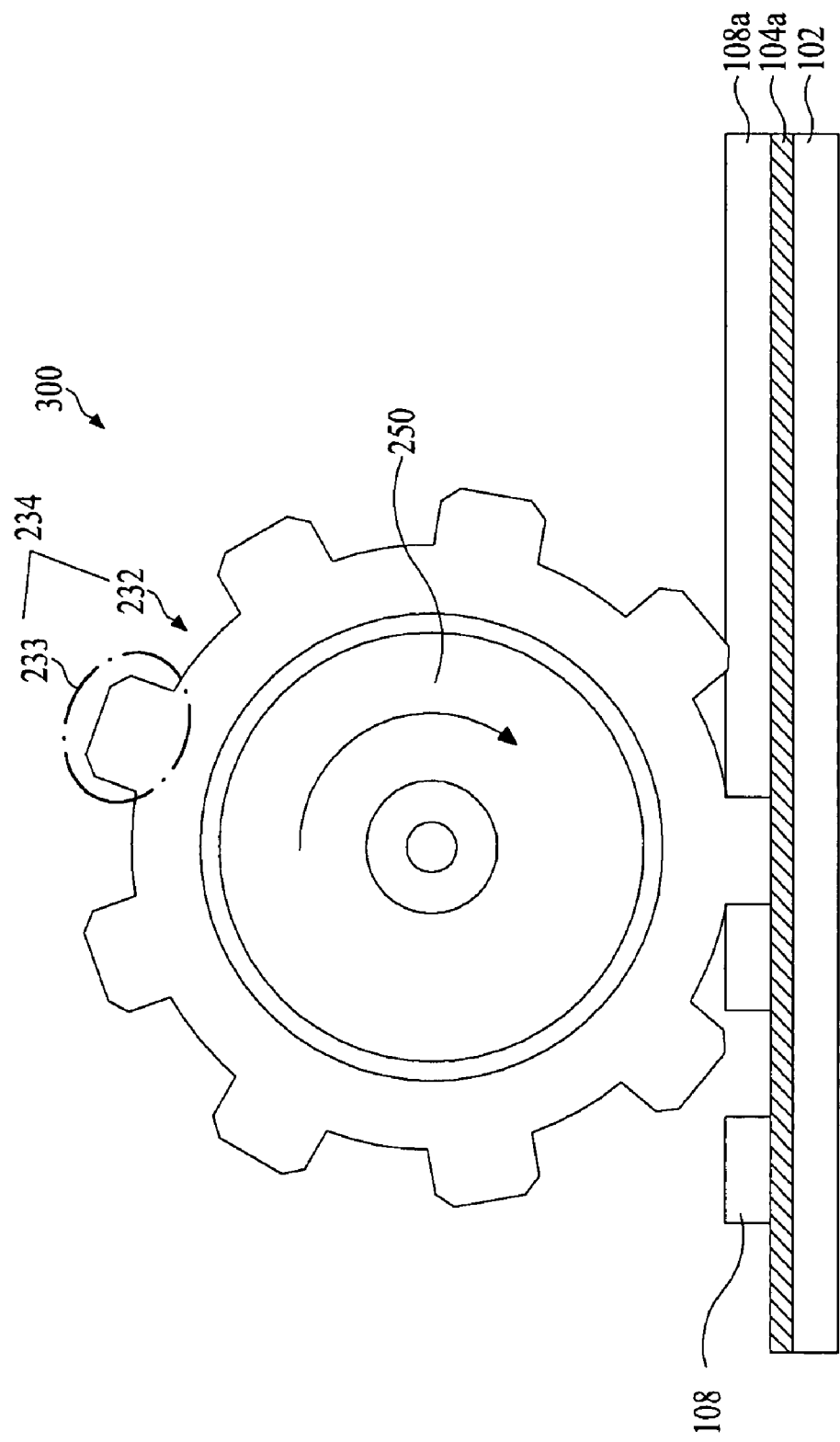

FIG. 7A and FIG. 7B illustrate a roll printing apparatus using the soft mold of FIG. 4 and the process steps of forming a thin film pattern using the same.

A roll printing apparatus 300 is aligned on the substrate 102 on which the thin film 104a and the etch resist solution 106a are coated.

The roll printing apparatus 300 includes a roll type printing roller 250, the soft mold 234 shown in FIG. 4, surrounding the printing roller 250, and an ultraviolet irradiator (not shown). The soft mold 234, as shown in FIG. 4, includes a concave portion 232 that receives the etch resist solution 106a and a convex portion 233 that is convex based on the bottom of the concave portion 232. The end of the convex portion 233 includes a trapezoidal region P.

The roll printing apparatus 300 is rotated. At the same time, pressure is applied to the etch resist solution 106a and the ultraviolet irradiator irradiates ultraviolet rays. Thus, etch resist pattern 106 is formed. The etch resist pattern 106 shown in FIG. 7A has the same shape as that of the etch resist pattern 106 shown in FIG. 5B.

That is, as the end of the convex portion 233 of the soft mold 234 is formed in a trapezoidal shape, the lower width D1 of the etch resist pattern 106 may be formed to be wider than the upper width D2 of the etch resist pattern 106.

Then, a wet etching process or a dry etching process is performed using the etch resist pattern 106 as a mask to form a thin film pattern 104 having the same width D1 as the lower width D1 of the etch resist pattern 106 as shown in FIG. 5C.

In FIG. 7B, the roll printing apparatus 300 is rotated. At the same time, pressure is applied to the etch resist solution 108a and the ultraviolet irradiator irradiates ultraviolet rays, so that the etch resist pattern 108 is formed. In this case, a trapezoidal region P at the end of the convex portion 233 is pressed like FIG. 6A.

Thus, the etch resist pattern 108 shown in FIG. 7B has the same shape as that of the etch resist pattern 108 shown in FIG. 6B.

In other words, because the end region of the convex portion 233 of the soft mold 234 is pressed by pressure, the lower width D2 of the etch resist pattern 106 becomes substantially the same as the upper width D2 of the etch resist pattern 106b.

Then, a wet etching process or a dry etching process is performed using the etch resist pattern 108 as a mask to form a thin film pattern 104 having the same width D2 as the upper width D2 of the etch resist pattern 108 as shown in FIG. 6C.

Figure 8A:
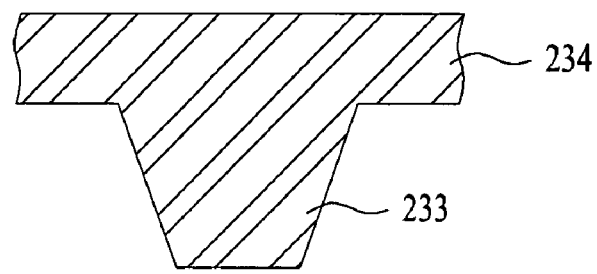
FIG. 8A, FIG. 8B and FIG. 8C are sectional views illustrating a convex of a soft mold having various shapes
Figure 8B:
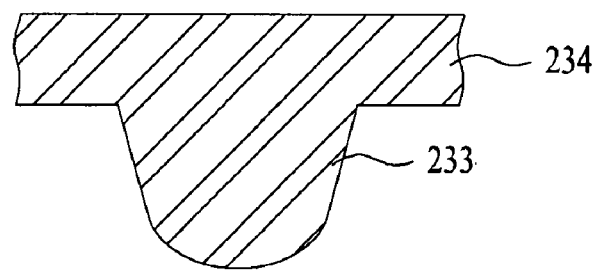
Figure 8C:
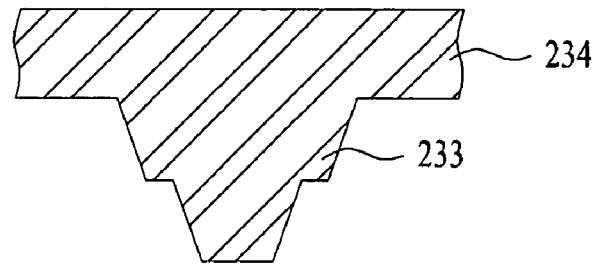

On the other hand, the convex 233 of the soft mold 234, controlled the predetermined linewidth according to the pressure applied to the soft mold 234, may have various shapes. As shown in FIG. 8A, the convex 233a has the both lateral sides being inclined at a predetermined angle. As shown in FIG. 8B, the convex 233b has the both lateral sides being inclined at a predetermined angle, the both lower corners being rounded and connected to the both lateral sides, and the rounded bottom surface being smoothly connected to the both lower corners. As shown in FIG. 8C, the convex 233c has the both lateral sides being stepped, each lateral side being inclined at a predetermined angle.

The apparatus for fabricating a thin film pattern and the method for fabricating a thin film pattern using the same according to the present invention may be used for patterning an electrode layer, an organic layer and an inorganic layer of a flat panel display device such as an LCD device, a FED device, a PDP and an EL display.

As described, the apparatus for fabricating a thin film pattern and the method for fabricating a thin film pattern using the same according to the present invention have the following advantages.

Because the thin film pattern is formed using the soft mold and an etch resist instead of a photolithography process, the fabricating process is simplified.

In addition, the line widths of the etch resist patterns can be controlled finely by the trapezoidal region formed at the end of the convex portion of the soft mold. Thus, as the etch resist pattern may be formed to minimize process deviation, reliability of the thin film pattern may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating an LCD device, the method comprising:

forming a thin film on a substrate;

forming an etch resist solution on the thin film;

applying a soft mold having a concave portion and a convex portion to the etch resist solution;

pressing the soft mold to the etch resist solution so that the etch resist solution is moved into the concave portion of the soft mold;

hardening the etch resist solution to form an etch resist pattern which is transferred from the concave portion of the soft mold;

separating the soft mold from the substrate; and patterning the thin film using the etch resist pattern as a mask, wherein the soft mold comprises elastic material, wherein an end of the convex portion of the soft mold includes a trapezoidal shaped cross section, a first plane being an outer surface of the convex portion, a second plain being parallel to the first plane and having an area and a width greater than those of the first surface, at least two incline planes connecting the first plane and the second plane, an incline angle defined as an external angle between an extension of the first plane and one of the at least two incline planes, and a height between the first plane and the second plane, and wherein a width of the etch resist pattern is controlled by the incline angle and the height of the end of the convex portion which are variable depending upon the size of the pressure applied to the soft mold in the step of pressing the soft mold to the etch resist solution.

2. The method of claim 1, wherein the width of the etch resist pattern is controlled within a range between a first width corresponding to the first plane of the convex portion and a second width corresponding to the second plane of the convex plane, and wherein the first width is greater than the second width.

3. The method of claim 1, wherein the width of the etch resist pattern is controlled to be corresponding to the width of the first plane of the convex portion, if the pressure applied to the soft mold in the step of pressing the soft mold to the etch resist solution is a weight of the soft mold to maintain the height and the incline angle of the end of the convex portion.

4. The method of claim 1, wherein the width of the etch resist pattern is controlled to be corresponding to the width of the second plane of the convex portion, if the pressure applied to the soft mold in the step of pressing the soft mold to the etch resist solution is the weight of the soft mold with additional pressure to shrink the height and the incline angle of the end of the convex portion.

5. The method of claim 1,
wherein the soft mold is surface-treated to be hydrophobic if the etch resist solution is hydrophilic, or
wherein the soft mold is surface-treated to be hydrophilic if the etch resist solution is hydrophobic.

6. The method of claim 1 further comprising, restoring the soft mold after the step of separating the soft mold from the substrate.

7. A method for fabricating an LCD device, the method comprising:
forming a thin film on a substrate;
forming an etch resist solution on the thin film;
applying a printing roller on the etch resist solution;
rolling the printing roller on the etch resist solution for pressing a soft mold surrounding the printing roller and having a concave portion and a convex portion to the substrate so that the etch resist solution is moved into the concave portion of the soft mold;

hardening the etch resist solution to form an etch resist pattern which is transferred from the concave portion of the soft mold; and patterning the thin film using the etch resist pattern as a mask, wherein the soft mold comprises elastic material,
wherein an end of the convex portion of the soft mold includes a trapezoidal shaped cross section, a first plane being an outer surface of the convex portion, a second plain being parallel to the first plane and having an area and a width greater than those of the first surface, at least two incline planes connecting the first plane with the second plane, an incline angle defined as an external angle between an extension of the first plane and one of the at least two incline planes, and a height between the first plane and the second plane, and wherein a width of the etch resist pattern is controlled by the incline angle and the height of the end of the convex portion which are variable depending upon the size of the pressure applied to the soft mold in the step of rolling the printing roller on the etch resist solution.

8. The method of claim 7, wherein the width of the etch resist pattern is controlled within a range between a first width by the first plane of the convex portion and a second width by the second plane of the convex plane, and wherein the first width is greater than the second width.

9. The method of claim 7, wherein the width of the etch resist pattern is controlled to be corresponding to the width of the first plane of the convex portion, if the pressure applied to the soft mold in the step of rolling the printing roller on the etch resist solution is without additional pressure to maintain the height and the incline angle of the end of the convex portion.

10. The method of claim 7, wherein the width of the etch resist pattern is controlled to be corresponding to the width of the second plane of the convex portion, if the pressure applied to the soft mold in the step of rolling the printing roller on the etch resist solution is with additional pressure to shrink the height and the incline angle of the end of the convex portion.

11. The method of claim 7,
wherein the soft mold is surface-treated to be hydrophobic if the etch resist solution is hydrophilic, or
wherein the soft mold is surface-treated to be hydrophilic if the etch resist solution is hydrophobic.

12. The method of claim 7, wherein the step of rolling the printing roller on the etch resist solution occurs simultaneously with the step of hardening the etch resist solution.

* * * * *